(12) United States Patent
Chen et al.

(10) Patent No.: US 11,527,558 B2
(45) Date of Patent: Dec. 13, 2022

(54) DISPLAY DEVICE

(71) Applicant: KunShan Go-Visionox Opto-Electronics Co., Ltd., Kunshan (CN)

(72) Inventors: Xinquan Chen, Kunshan (CN); Xiujian Zhu, Kunshan (CN); Mingwei Ge, Kunshan (CN); Zheng Wang, Kunshan (CN); Xuejing Zhu, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 484 days.

(21) Appl. No.: 16/568,275

(22) Filed: Sep. 12, 2019

(65) Prior Publication Data
US 2020/0006403 A1    Jan. 2, 2020

Related U.S. Application Data

(63) Continuation of application No. PCT/CN2018/086022, filed on May 8, 2018.

(30) Foreign Application Priority Data

Sep. 30, 2017  (CN) .......................... 201710916905.7

(51) Int. Cl.
*H01L 27/12*  (2006.01)
*G06V 10/141*  (2022.01)
(Continued)

(52) U.S. Cl.
CPC ........ *H01L 27/1255* (2013.01); *G06V 10/141* (2022.01); *G06V 40/1318* (2022.01); *G09G 3/3225* (2013.01); *G09G 3/3648* (2013.01)

(58) Field of Classification Search
CPC . H01L 27/1255; H01L 27/326; G06V 10/141; G06V 40/1318; G09G 3/3225;
(Continued)

(56) References Cited

U.S. PATENT DOCUMENTS 10,158,094 B2 * 12/2018 Lee ..................... H01L 51/5237
2004/0263072 A1 * 12/2004 Park ..................... H01L 27/3246
313/509
(Continued)

FOREIGN PATENT DOCUMENTS

CN  102110783 A  6/2011
CN  103681755 A  3/2014
(Continued)

OTHER PUBLICATIONS

TW First Office Action dated Aug. 23, 2018 in the corresponding TW application (application No. 107121931).
(Continued)

*Primary Examiner* — S M Sohel Imtiaz
(74) *Attorney, Agent, or Firm* — Kilpatrick Townsend & Stockton

(57) ABSTRACT

The present application relates to a display device that is divided into a first region as a fingerprint recognition region and a second region as a display region with the first region having a first light transmittance greater than a second light transmittance of the second region. The light transmittance of the region corresponding to the fingerprint recognition module group in the display device of the present application can be increased, thereby further improving the sensitivity of the fingerprint recognition module group.

3 Claims, 7 Drawing Sheets

(51) Int. Cl.
*G06V 40/13* (2022.01)
*G09G 3/3225* (2016.01)
*G09G 3/36* (2006.01)

(58) Field of Classification Search
CPC ......... G09G 3/3648; G09G 2300/0465; G09G 2300/0819; G09G 2300/0842; G09G 2300/0861; G09G 2310/0251; G09G 3/3233; G02F 1/1362
See application file for complete search history.

(56) References Cited

U.S. PATENT DOCUMENTS

| | | | |
|---|---|---|---|
| 2006/0017862 A1* | 1/2006 | Song | G06V 40/1318 349/42 |
| 2008/0291368 A1* | 11/2008 | Park | G02F 1/13471 349/74 |
| 2012/0133872 A1* | 5/2012 | Kim | G02F 1/133753 349/128 |
| 2014/0077186 A1* | 3/2014 | Kim | H01L 27/3218 257/40 |
| 2015/0333737 A1* | 11/2015 | Wang | G09G 3/3696 345/92 |
| 2016/0054844 A1* | 2/2016 | Lin | G06F 3/041661 345/173 |
| 2017/0147850 A1* | 5/2017 | Liu | G06F 3/0443 |
| 2019/0197286 A1* | 6/2019 | Kim | G06V 40/1318 |
| 2020/0020737 A1* | 1/2020 | Jin | H01L 23/29 |

FOREIGN PATENT DOCUMENTS

| | | |
|---|---|---|
| CN | 105140394 A | 12/2015 |
| CN | 106252521 A | 12/2016 |
| CN | 103972416 B | 2/2017 |
| CN | 106374051 A | 2/2017 |
| CN | 107123367 A | 9/2017 |
| CN | 107194321 A | 9/2017 |
| CN | 107195675 A | 9/2017 |
| CN | 107689422 A | 2/2018 |
| CN | 107863370 A | 3/2018 |
| JP | 2824411 B2 | 11/1998 |
| KR | 20170064014 A | 6/2017 |
| TW | 200406635 A | 5/2004 |
| TW | 201248894 A1 | 12/2012 |

OTHER PUBLICATIONS

TW First Office Action dated Nov. 30, 2018 in the corresponding TW application (application No. 107121931).
CN Refusal Decision dated Feb. 3, 2020 in the corresponding CN application (application No. 2017109169057).
CN Third Office Action dated Sep. 30, 2019 in the corresponding CN application (application No. 201710916905.7).
International Search Report of International Application No. PCT/CN2018/086022.
First Office Action of Taiwan Application No. 107117601.
Notice of Allowance of Taiwan Application No. 107117601.
First Office Action of Chinese Application No. 2017109169057.
Second Office Action of Chinese Application No. 2017109169057.
Preliminary Public Information.

* cited by examiner

DISPLAY DEVICE

CROSS-REFERENCES TO RELATED APPLICATIONS

The present application is a continuation application of the PCT application submitted on May 8, 2018 with the application number of PCT/CN2018/086022, which claims the priority to Chinese patent application No. 201710916905.7, filed with Chinese Patent Office on Sep. 30, 2017, entitled "DISPLAY DEVICE". Both applications are incorporated herein by reference in their entirety.

TECHNICAL FIELD

The present application relates to organic light-emitting diode (OLED) technologies, and in particular to display devices.

BACKGROUND

An OLED device has advantages such as self-luminous, low driving voltage, high luminous efficiency, short response time, high definition and contrast ratio, wide viewing angle, and flexible display and full-color display for large size, and thus the OLED is recognized by the industry as the most promising display technology.

Active Matrix OLEDs (AMOLEDs) use thin film transistors with capacitors to store signals to control the brightness and grayscale of the OLEDs. Each individual OLED is electrically connected to a corresponding thin film transistor, thereby forming a matrix of pixels. An array circuit formed by the thin film transistors determines the light emission of the pixel and further determines the constitution of the image. AMOLED has advantages such as large size, power saving, high resolution, and long panel life, and is generally used as a large-sized display device with high definition.

SUMMARY

In order to solve the problem of low sensitivity of the fingerprint recognition module group in the display device, the present application provides a display device that is divided into a first region as a fingerprint recognition region and a second region as a display region, and a first light transmittance of the first region is greater than a second light transmittance of the second region.

The display device of the present application has an increased light transmittance of the region corresponding to a fingerprint recognition module group and therefore the sensitivity of the fingerprint recognition module group can be improved.

DETAILED DESCRIPTION OF THE INVENTION

As explained above, AMOLED has a wide range of applications. At present, with the development of the information industry, electronic products such as laptop computers, tablet computers, mobile phones and game devices have entered an era of intelligence. Due to the uniqueness of the fingerprint pattern, in order to improve the use safety and convenience of electronic products, many electronic products are designed with fingerprint recognition module groups to enhance the safety and convenience of the device.

However, the high-PPI AMOLED screen which is above the full HD may have insufficient overall light transmittance of the screen due to a high pixel density and a small effective area of a light hole of a pixel unit, thereby resulting in low sensitivity of the fingerprint recognition module group.

Figure 1:
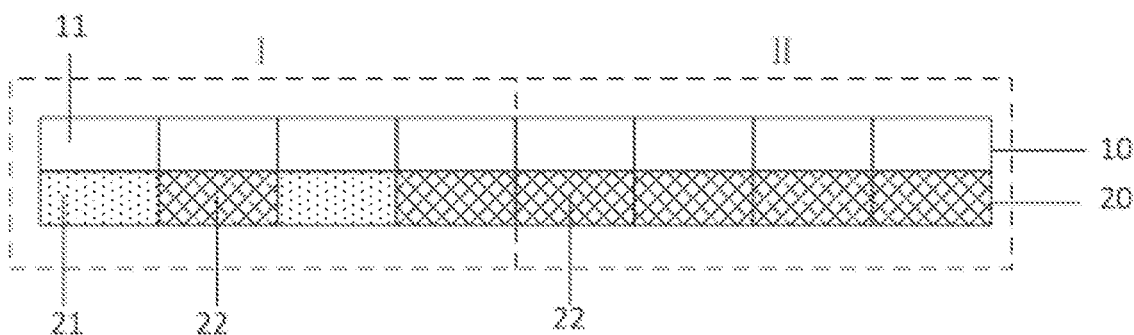
FIG. 1 is a schematic view of a display device in accordance with an embodiment of the present application.

In an embodiment in accordance with the present application, as shown in FIG. 1, a display device comprises a display layer 10 and a driving layer 20, the display layer 10 is formed by a plurality of display units 11 arranged in an array, and the driving layer 20 is formed by a plurality of driving units arranged in an array that will be described in detail later. Preferably, the driving units are electrically connected with the display units 11 in one-to-one correspondence such that each display unit is independently driven by an individual driving unit to speed up the refresh rate upon scanning. The display layer 10 and the driving layer 20 are stacked, and the light emitted from the display layer 10 is transmitted through the driving layer 20, that is the display device is a bottom-emission type display device, or the light emitted from the display layer 10 can be transmitted toward the opposite side of the side where the driving layer 20 is located, that is the display device is a is a top-emission type display device. The present application is not limited by the light-emitting type of the display layer 10, and the light-emitting type of the display layer 10 can be arbitrarily selected as needed. Further, the display unit 11 in the display layer 10 can be an organic electroluminescent unit, a liquid crystal cell, or a combination of an organic electroluminescent unit and a liquid crystal cell.

As shown in FIG. 1, the display device comprises a first area I as a fingerprint recognition area and a second area II as a display region. Although in FIG. 1, the first region I is located on the left side of the second region II and the sizes of both are the same, the present application is not limited thereto. It should be understood that FIG. 1 is only used to schematically illustrate the present application, and is not intended to show the positional relationship and dimensional relationship of the first region I and the second region II clearly and equidistantly. In other words, the positional relationship and the dimensional relationship of the first region I and the second region II can be appropriately changed. For example, the first region I may be located on the right side of the second region II in FIG. 1 or may be located at any suitable position relative to the second region II in the plan view, and the size of the first region I can be smaller or larger than the size of the second region II.

It is well known in the art that a fingerprint recognition module group comprises a fingerprint recognition module, and a circuit board etc., and the fingerprint recognition module is mounted on the circuit board and electrically connected to the circuit board A fingerprint recognition module group (not shown) for recognizing a fingerprint is provided at a corresponding position to the first area I. When the display device is a bottom-emission type display device, the fingerprint recognition module in the fingerprint recognition module group can be disposed on the opposite side of the side of the display layer 10 on which the driving layer 20 is located. When the display device is a top-emission type display device, the fingerprint recognition module can be disposed on the opposite side of the side of the display layer 10 on which the driving layer 20 is located.

During fingerprint recognition, the area corresponding to the fingerprint recognition module group (i.e. the first area I) is touched with a finger, and meanwhile the light at that area may be interfered by the finger, so that the light reflected or scattered by the finger can carry the spatial image information of the finger back to the fingerprint recognition module group, and then the fingerprint recognition module group recognizes the spatial image information and determines whether the spatial image information belongs to a user who is allowed to access.

The sensitivity of the fingerprint recognition module group is crucial to the user experience, and the light transmittance has a significant effect on the sensitivity, that is the higher the light transmittance is, the higher the sensitivity is. In order to increase the light transmittance and thereby improving the sensitivity of the fingerprint recognition module group, it is conceivable to increase the effective area of the light hole of the pixel unit. However, this contradicts the trend of enlargement of the pixel density and miniaturization of the effective area of the light hole of the pixel unit. Therefore, it is difficult to increase the light transmittance by increasing the effective area of the light hole of the pixel unit.

In view of this, the inventors have unexpectedly discovered by research that the sensitivity of the fingerprint recognition module group can be improved by changing the driving unit in the region of the display layer 10 corresponding to the fingerprint recognition module group (i.e. the first region I) to increase the light transmittance of the first region I without contradicting the above mentioned development trend. Specifically, compared with the case that the first region I and the second region of the display device are both constituted by the same driving unit which are the same as driving unit in the second region II of the present application, the driving unit in the first region I of the display device according to the present application is not exactly the same as the driving unit in the second area II, so that a first light transmittance of the first region I of the present application is greater than a second light transmittance of the first region of the above case. In the present application, unless otherwise stated, the expression "the driving unit in the first region I is not exactly the same as the driving unit in the second region II" means that the first region I has the same driving unit as the second region II while, the first region I still has a different driving unit from the second region II.

The above changes will be explained below in the embodiment 1 and 2 which are preferred embodiments of the present application.

EMBODIMENT 1

As shown in FIG. 1, the driving unit in the driving layer 20 comprises a first driving unit 21 and a second driving unit 22, and the structure of the first driving unit 21 is simpler than the structure of the second driving unit 22. In the present application, unless otherwise stated, the expression "the structure of the first driving unit 21 is simpler than the structure of the second driving unit 22" means the number of light-blocking elements constituting the first driving unit 21 is less than the number of light-blocking elements constituting the second driving unit 22, except that, the first driving unit 21 and the second driving unit 22 are substantially the same. Further, since the driving unit is mainly composed of a thin film transistor and a capacitor, the expression "the structure of the first driving unit 21 is simpler than the structure of the second driving unit 22" mainly refers to the number of thin film transistors and capacitors constituting the first driving unit 21 is less than the number of thin film transistors and capacitors constituting the second driving unit 22. Still further, the light-blocking element comprises a source electrode, a drain electrode, a gate electrode, a capacitor electrode, and a wire.

Figure 2:
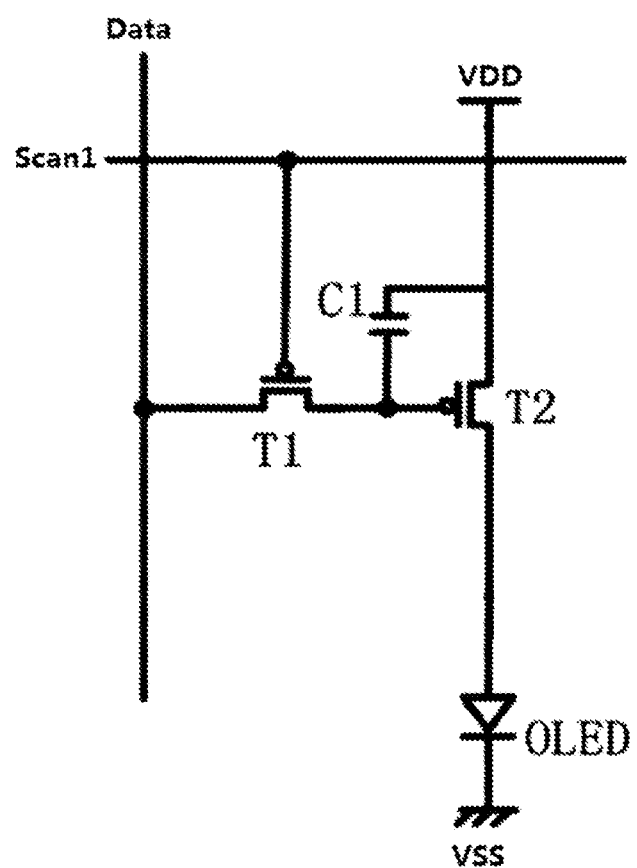
FIG. 2 is a schematic structural view of a first driving unit according to an embodiment of the present application.
Figure 3:
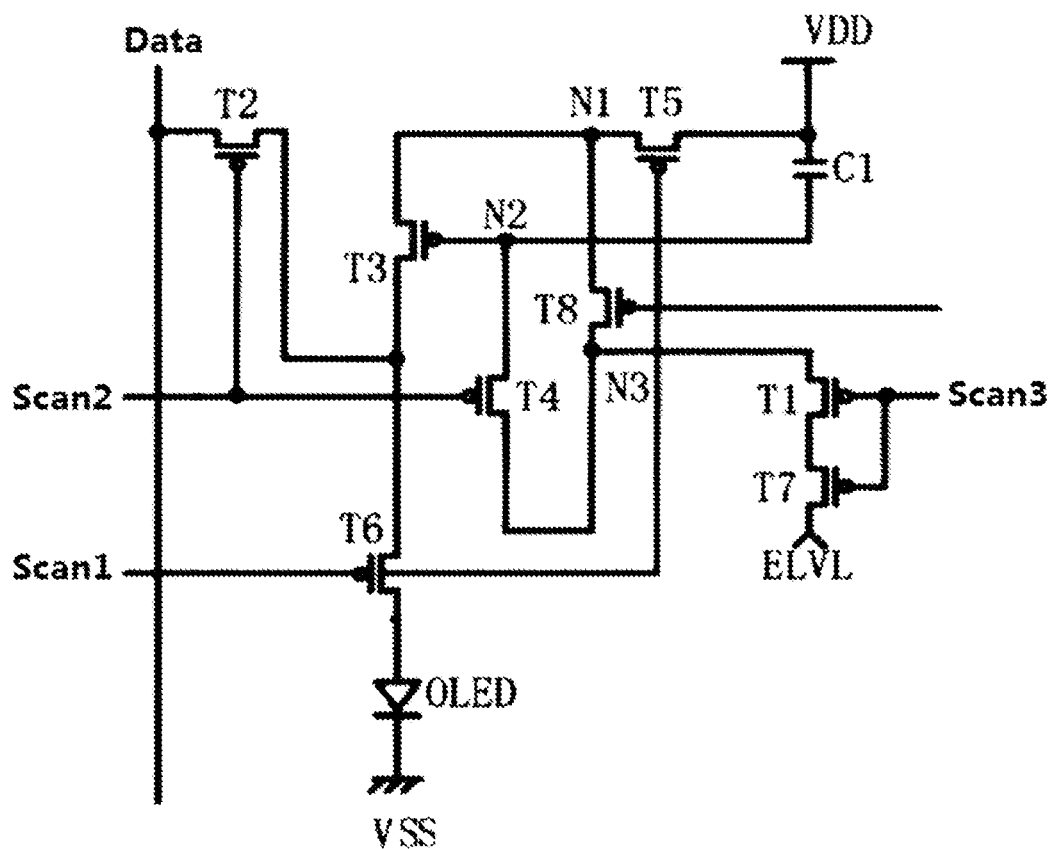
FIG. 3 is a schematic structural view of a second driving unit according to an embodiment of the present application.

As an example of the foregoing description, as shown in FIG. 2, the first driving unit 21 can include two thin film transistors and one capacitor (hereinafter referred to as 2T1C, T represents a thin film transistor, C represents a capacitor; the same applies hereinafter). As shown in FIG. 3, the second driving unit 22 can include eight thin film transistors and one capacitor (hereinafter abbreviated as 8T1C). Although the first driving unit 21 is simpler than the second driving unit 22, the first driving unit 21 can still illuminate at a normal timing sequence without adjusting the scanning signal lines and the data lines. In addition, during normal display of the display device, data compensation can be separately performed towards the first driving unit 21 in the first region I by driving of the chip to eliminate the influence of the simplification of the first driving unit 21 on the display effect.

In the following description, the first driving unit 21 comprising 2T1C and the second driving unit 22 comprising 8T1C will be described below as an example. However, the application is not limited thereto. For example, the first driving unit 21 can comprise 3T1C, the second driving unit 22 can comprise 9T1C, or the first driving unit 21 can comprise 3T1C, and the second driving unit 22 can comprise 8T1C.

When the other conditions are the same, the less the number of light-blocking elements (such as thin film transistors and capacitors) constituting the driving unit is, the higher the light transmittance of the driving unit is. Therefore, the light transmittance of the first driving unit 21 is greater than the light transmittance of the second driving unit 22 in this embodiment.

In the present embodiment, the driving layer 20 corresponding to the first region I comprises the first driving unit 21 and the second driving unit 22, and the driving layer 20 corresponding to the second region II comprises only the second driving unit 22, and thus the first light transmittance of the first region I is greater than the second light transmittance of the second region II in the condition that the first region I and the second region II are in the same size, that is to say, the first light transmittance of the first region I is greater than the second light transmittance of the first region of the above case. The ratio of the number of the first driving unit 21 to the number of the second driving unit 22 in the first region I is not particularly defined as long as the first driving unit 21 and the second driving unit 22 as the driving units can achieve desired functions. However, although the ratio can theoretically be zero, preferably the ratio is not zero taken into account of performing the function of the driving unit sufficiently.

In this way, as compared with the case where both the first region and the second region of the display device are constituted by the second driving unit 22, the display device according to the present application could have an increased light transmittance of the first region and thereby improving the sensitivity of the fingerprint recognition module group without affecting the function of the driving unit and the resolution of the display region.

Although in the present embodiment, the second region II only comprises the second driving unit 22, in the case of not affecting the function of the second region II, in addition to the second driving unit 22, the second region II may further comprise a first driving unit 21 in view of such as easy preparation and cost reduction, etc.

An exemplary arrangement of the driving units in the driving layer 20 corresponding to the first region I will be described below with reference to FIGS. 4 to 7. In the following description, as an example for illustration, the driving layer 20 comprises a 4×8 driving units, the driving layer 20 corresponding to the first region I and the second region II comprises a 4×4 driving units respectively and the second region II comprises only the second driving unit 22. In the present application, unless otherwise stated, the expression such as "x×y driving units" means a driving unit of x rows and y columns. The number of rows and columns of the driving unit are not particularly limited, for example, the driving layer 20 may comprise 4×10 driving units. Further, the number of rows and columns of the driving units in the first region I may be the same as or different from the number of rows and columns of the driving units in the second region II. For example, when the driving layer 20 comprises 4×8 driving units, the first region I may comprise 4×3 driving units, and the second region II may comprise 4×5 driving units.

Figure 4:
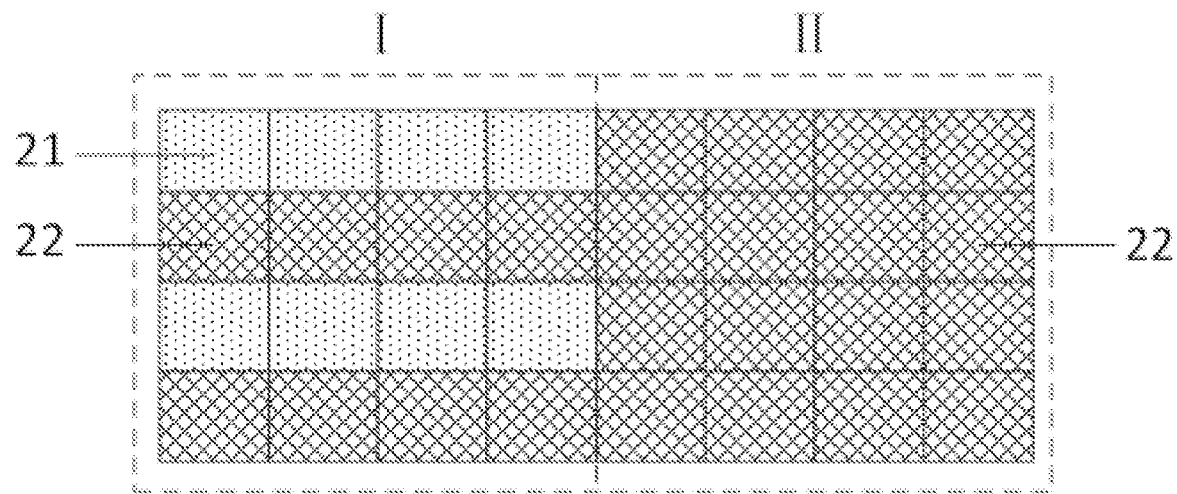
FIG. 4 is a schematic view showing an arrangement of a driving unit according to an embodiment of the present application.

As shown in FIG. 4, the driving layer 20 corresponding to the first region I comprises 4×4 driving units, four of the first driving units 21 are arranged in a first-unit row (or a first-unit column), and four of the second driving units 22 are arranged in a second-unit row (or a second-unit column), and the first-unit row (or the first-unit column) and the second-unit row (or the second-unit column) are alternately arranged. In this manner, the first driving unit 21 and the second driving unit 22 in the first region I are regularly arranged, such that the light transmittance of entire first region I can be increased thus further ensuring a uniform light transmission of the first region I, thereby improving the sensitivity of the fingerprint recognition module group.

Figure 5:
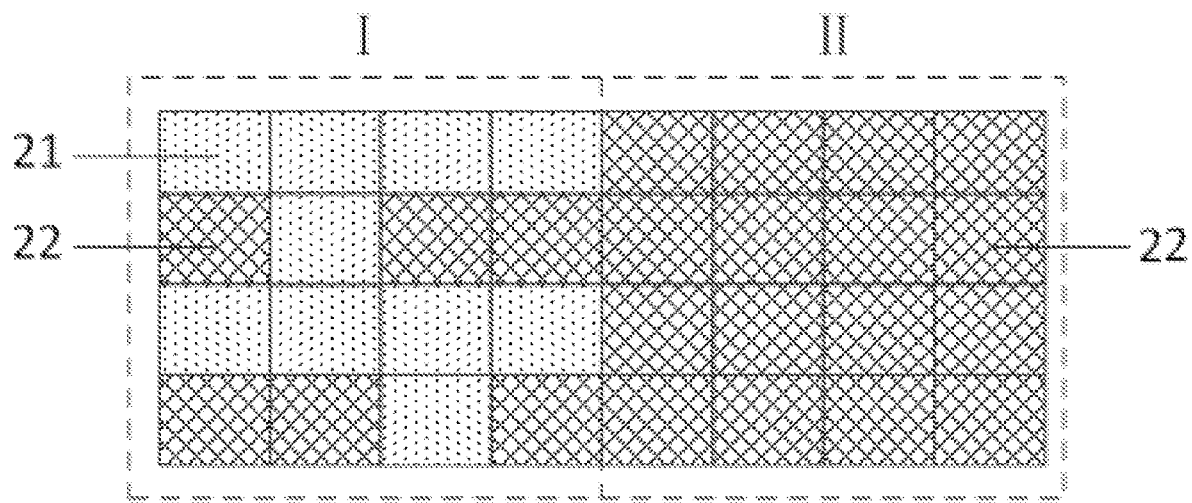
FIG. 5 is a schematic view showing another arrangement of a driving unit according to an embodiment of the present application.

As shown in FIG. 5, the difference from the FIG. 4 is mainly that when the first driving units 21 are arranged in rows (or columns), at least one (preferably, not all) of the second driving units 22 located in the same row (or the same column) in the driving layer 20 corresponding to the first regions I is changed to the first driving unit 21. In this way, the light transmittance of entire first region I can be increased thus further ensuring a uniform light transmission of the first region I, thereby further improving the sensitivity of the fingerprint recognition module group.

Figure 6:
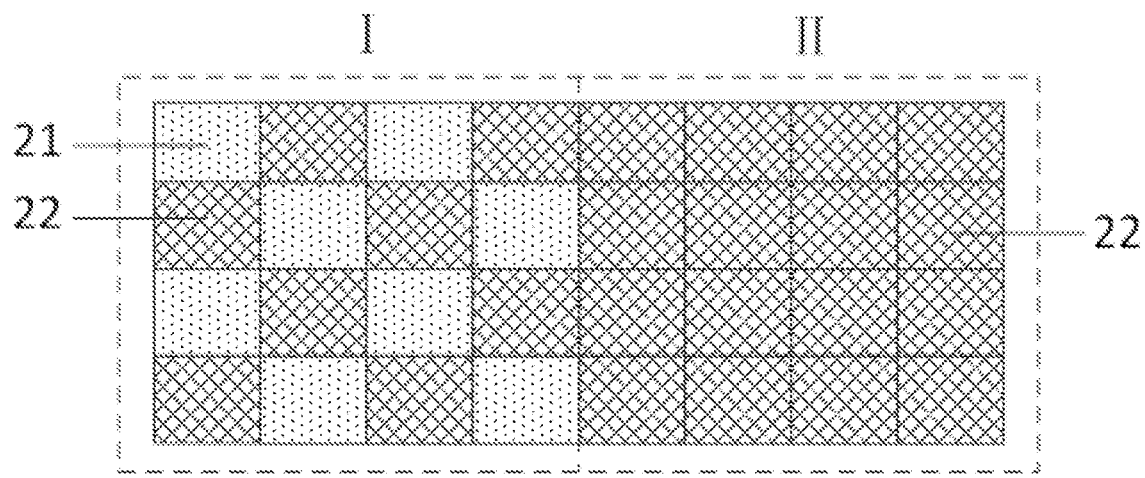
FIG. 6 is a schematic view showing still another arrangement of the driving unit according to an embodiment of the present application.

As shown in FIG. 6, the first driving unit 21 and the second driving unit 22 are alternately arranged in the left and right direction and the up and down direction. In this way, the light transmittance of entire first region I can be increased thus further ensuring a uniform light transmission of the first region I, thereby further improving the sensitivity of the fingerprint recognition module group.

Figure 7:
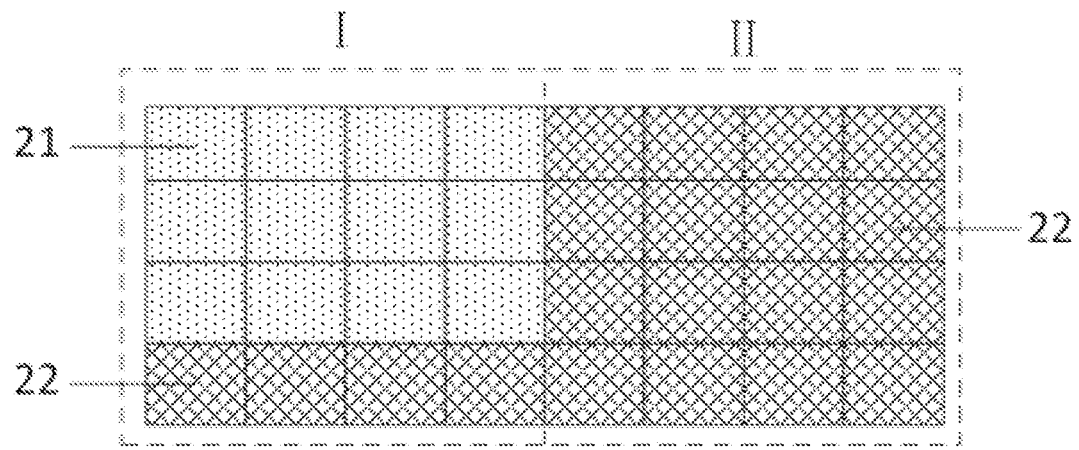
FIG. 7 is a schematic view showing still another arrangement of the driving unit according to an embodiment of the present application.

As shown in FIG. 7, four of the second driving units 22 are arranged in rows (or columns), and the rows of the second driving units are continuously arranged and the remaining positions in the array of the driving layer 20 corresponding to the first region I are occupied by the first driving units 21. In this way, the light transmittance of entire first region I can be increased thus further ensuring an increase in the light transmittance of the majority of the region that receives the light reflected or scattered by the finger in the first region I, thereby further improving the sensitivity of the fingerprint recognition module group.

EMBODIMENT 2

In the present embodiment, the differences from the embodiment 1 will be mainly described, and the description of the part that is the same as the embodiment 1 will be omitted.

The difference between the present embodiment and the embodiment 1 is mainly that the present embodiment uses the mode that is a sum of the projection areas of light-blocking elements (such as thin film transistors and capacitors) constituting the first driving units 21 on a plane of the driving layer 20 is smaller than the sum of the projection areas of light-blocking elements constituting the second driving units 22 on a plane of the driving layer 20. In this manner, the light transmittance of the first driving units 21 is made greater than the light transmittance of the second driving units 22 and the light transmittance of the entire first region I can be increased, thereby further improving the sensitivity of the fingerprint recognition module group.

It should be understood that, for the expression "the sum of the projection areas of light-blocking elements (hereinafter simply referred to as first constituent elements) constituting the first driving units 21 on a plane of the driving layer 20", when there exists no overlapping portion among the projections of the first constituent elements on the driving layer 20, the sum of the projection areas of the first constituent elements on the driving layer 20 equals to the sum of projection areas of each of the first constituent elements on the plane of the driving layer 20; when there exists an overlapping portion among the projections of the first constituent elements on the driving layer 20, the sum of the projection areas of the first constituent elements on the driving layer 20=the sum of the projection areas of each of the first constituent elements on the plane of the driving layer 20−[the areas of the overlapping portions×(the number of the first constituent elements overlapping each other−1)].

Similarly, for the expression "the sum of the projection areas of the light-blocking elements (hereinafter simply referred to as second constituent elements) constituting the second driving units 21 on a plane of the driving layer 20", when there exists no overlapping portion among the projections of the second constituent elements on the driving layer 20, the sum of the projection areas of the second constituent elements on the driving layer 20 is the sum of the projection areas of each of the second constituent elements on the plane of the driving layer 20; when there exists an overlapping portion among the projections of the second constituent elements on the driving layer 20, the sum of the projection areas of the second constituent elements on the driving layer 20=the sum of the projection areas of each of the second constituent elements on the plane of the driving layer 20−[the areas of the overlapping portions×(the number of the second constituent elements overlapping each other−1)].

In addition, the ratio of the projection areas of the first driving units 21 to the projection areas of the second driving units 22 is not particularly limited as long as the light transmittance of the first region I meets the requirement and does not affect the display effect and function of the display device of the present application. For example, the ratio can be 1:2-3:4, preferably 1:2-5:8, more preferably 1:2.

The invention claimed is:

1. A display device, comprising a first region as a fingerprint recognition region and a second region as a display region, the first region having a first light transmittance greater than a second light transmittance of the second region, the display device comprises a driving layer comprising first driving units and second driving units, the number of thin film transistors and capacitors constituting each first driving unit is less than the number of thin film transistors and capacitors constituting each second driving unit, and the light transmittance of each first driving unit is greater than the light transmittance of each second driving unit, the first region comprises both the first driving units and the second driving units, and the second region only comprises the second driving units, wherein, in the first region, the first driving units and the second driving units are alternately arranged in a left-and-right direction and in an up-and-down direction.

2. The display device according to claim 1, wherein the number of light-blocking elements constituting each first driving units is less than the number of light-blocking elements constituting each second driving unit, said light-blocking elements include a source electrode, a drain electrode, a gate electrode, a capacitor electrode, and a wire.

3. The display device according to claim 1, wherein a sum of projection areas of light-blocking elements constituting each first driving units on a plane of the driving layer is smaller than the sum of the projection areas of the light-blocking elements constituting each second driving units on a plane of the driving layer, said light-blocking elements include a source electrode, a drain electrode, a gate electrode, a capacitor electrode, and a wire.

\* \* \* \* \*